United States Patent [19]

Williams

[11] 4,090,257
[45] May 16, 1978

[54] DUAL MODE MNOS MEMORY WITH PAIRED COLUMNS AND DIFFERENTIAL SENSE CIRCUIT

[75] Inventor: David W. Williams, Baltimore, Md.

[73] Assignee: Westinghouse Electric Corp., Pittsburgh, Pa.

[21] Appl. No.: 700,235

[22] Filed: Jun. 28, 1976

[51] Int. Cl.² ............................................. G11C 11/40
[52] U.S. Cl. .................................................. 365/184
[58] Field of Search ...................... 340/173 R; 307/238

[56] References Cited

U.S. PATENT DOCUMENTS

| 3,728,695 | 4/1973 | Bentchkowsky | 340/173 R |
| 3,851,317 | 11/1974 | Kenyon | 340/173 R |

OTHER PUBLICATIONS

Krick, Self-Differential Sensing of MNOS Memory Arrays, IBM Technical Disclosure Bulletin, vol. 16, No. 12, 5/74, pp. 4098-4099.

*Primary Examiner*—Stuart N. Hecker
*Attorney, Agent, or Firm*—H. W. Patterson

[57] ABSTRACT

A memory system utilizing an array of dual gate variable threshold MNOS memory transistors is disclosed which may be operated such that a single MNOS transistor is used to store each bit of digital information or in a second mode which utilizes two MNOS transistors for each bit stored. The threshold of the transistor interrogated is used to determine the state of a flip-flop comprising a pair of cross-coupled MNOS transistors. A particular transistor of the array is interrogated by coupling appropriate "row select" and "column select" signals to the row and column select terminals. Transistors comprising the first and second columns have their source terminals connected in common and to the drain terminal of the first transistor of the cross-coupled pair. Similarly for, the third and fourth columns. First and second reference transistors also have their source terminals respectively coupled to the drain terminals of the first and second transistors comprising said cross-coupled pair. In either mode, the cross-coupled pair is utilized as the sensing circuit for determining the threshold state of the MNOS memory transistor interrogated. The circuitry coupled to the drains of each transistor comprising the cross-coupled pair is identical resulting in a symmetrical circuit.

12 Claims, 5 Drawing Figures

DUAL MODE MNOS MEMORY WITH PAIRED COLUMNS AND DIFFERENTIAL SENSE CIRCUIT

BACKGROUND OF THE INVENTION

1. Field of the Invention

The invention relates to MNOS transistors and more particularly to arrays of dual gate MNOS memory transistors which present a substantially symmetrical load to a sensing circuit.

2. Description of the Prior Art

The threshold voltage of MNOS memory transistors can be shifted by selectively biasing the transistor. In utilizing these transistors as digital memories, the threshold voltage is selectively shifted between two levels which represent the two values of the digital signal to be stored. Shifting the threshold voltage causes the conductivity of the transistor to change for a given gate voltage. In most applications a plurality of MNOS memory transistors are arranged in arrays.

In typical prior art circuits, the MNOS memory transistor to be interrogated to determine its threshold state was enabled and utilized as the load of one transistor of a cross-coupled pair and a reference transistor was utilized as the load for the second transistor comprising the cross-coupled pair. Since the MNOS memory transistor interrogated was one member of an array, the loads of the transistors comprising the cross-coupled pair were grossly dissimilar, particularly with respect to the capacitive loading. This dissimilarity could be partially compensated for by selecting the geometry of the memory transistors with respect to the geometry of the reference transistor; however, the imbalance was always present and could lead to critical timing problems.

SUMMARY OF THE INVENTION

The array of MNOS memory transistors which is the subject of this invention utilizes an array of dual gate memory transistors. The array is preferably arranged such that a cross-coupled pair of non-memory MNOS transistors serving as the threshold sensing circuit is associated with at least two columns of memory transistors. All of the source terminals of the first column of memory transistors are connected in common and to the drain terminal of the first transistor of the cross-coupled pair. Similarly, the source terminals of all the transistors of the second column are connected in common and to the drain terminal of the second transistor of the cross-coupled pair. The drain terminals of the MNOS memory transistors are coupled to a negative voltage. (Assuming P-channel transistors) Additionally, a first reference transistor has its source connected to the drain of the first transistor of the cross-coupled pair and its drain terminals to a negative voltage. Similarly, a second reference transistor is connected to the second transistor of the cross-coupled pair.

In the single transistor per bit mode, a row enable signal and a column enable signal are coupled to the array. This couples an enable signal to both gates of the transistor situated at the intersection of the selected column and the selected row causing this transistor to be enabled. Assuming that the enabled memory transistor has its source coupled to the drain of the first transistor of the cross-coupled pair, an enable signal will also be coupled to the gate of the reference transistor having its source coupled to the drain of the second transistor of the cross-coupled pair. This causes the cross-coupled pair to assume a state determined by the relative conductivity of the enabled reference transistor with respect to the enabled memory transistor. The geometries of the transistors are selected such that if the memory transistor is in the low threshold state, the cross-coupled pair will assume a first state, and if it is in the high threshold state, the cross-coupled pair will assume a second state. All memory transistors comprising the array can be interrogated to determine their threshold state.

In the second mode of operation, both of the reference transistors are disabled and column select signals are coupled to two columns and a single row. In this mode an MNOS memory transistor from the first column is enabled to form the load for the first transistor of the cross-coupled pair and a memory transistor from the second column is enabled to form the load for the second transistor comprising the cross-coupled pair. The state of the cross-coupled pair will be determined by the relative conductivity of these two enabled memory transistors.

It can be seen that in either mode the circuitry coupled to the drains of the transistors comprising the cross-coupled pair is identical, leading to a totally symmetrical circuit. This substantially solves the problem associated with asymmetrical loading of the sensing flipflop. Additionally, the above-described array can be easily implemented as an integrated circuit.

DETAILED DESCRIPTION

Figure 1:
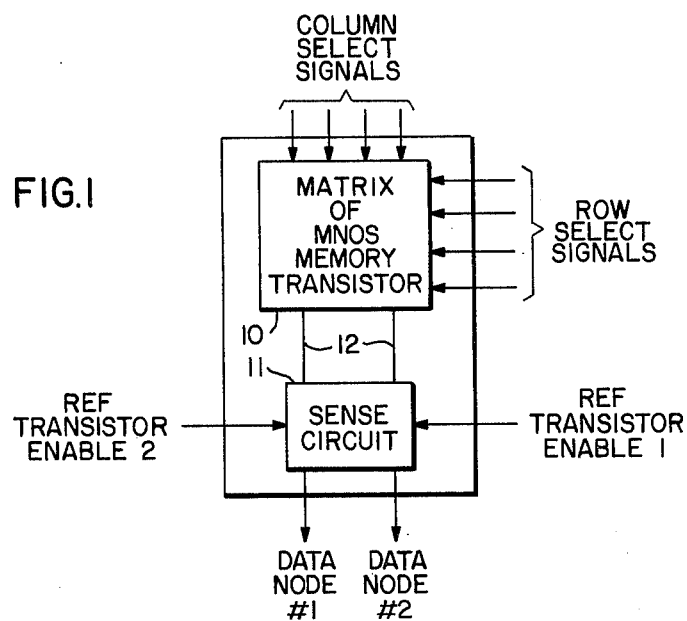
FIG. 1 is a functional block diagram of a memory system utilizing an array of dual gate MNOS transistors.

FIG. 1 is a functional block diagram of the dual mode MNOS memory system. The memory system consists of an array of dual gate MNOS memory transistors 10 coupled to a sense circuit 11. The MNOS memory transistors comprising the array 10 are arranged in columns and rows with each of the transistors having first and second gates. The first gates of the transistors comprising each column are connected in common to form terminals to which the column select signals are coupled. The second gates of the transistors comprising each of the rows are connected in common to form terminals to which the row select signals are coupled. Charge tunnelling to shift the threshold of each transistors is limited to the oxide underlying the second gate.

In the single transistor per bit mode a column select signal is coupled to one of the column select terminals and a row select signal is coupled to one of the row select terminals to enable one memory transistor of the array. A reference enable signal is also coupled to the sense circuit 11. Under these conditions the state of the cross-coupled pair included in the sense circuit 11 is determined by the relative transconductance of the enabled memory transistor and the enabled reference transistor. In the two transistors per bit mode, two columns and one row are enabled to enable two memory transistors in different columns. Under these conditions the state of the cross-coupled pair to be determined by the relative transconductance of the two enabled memory transistors. The difference between these modes of operation will be discussed in more detail later with reference to a schematic diagram of the array.

Figure 2:
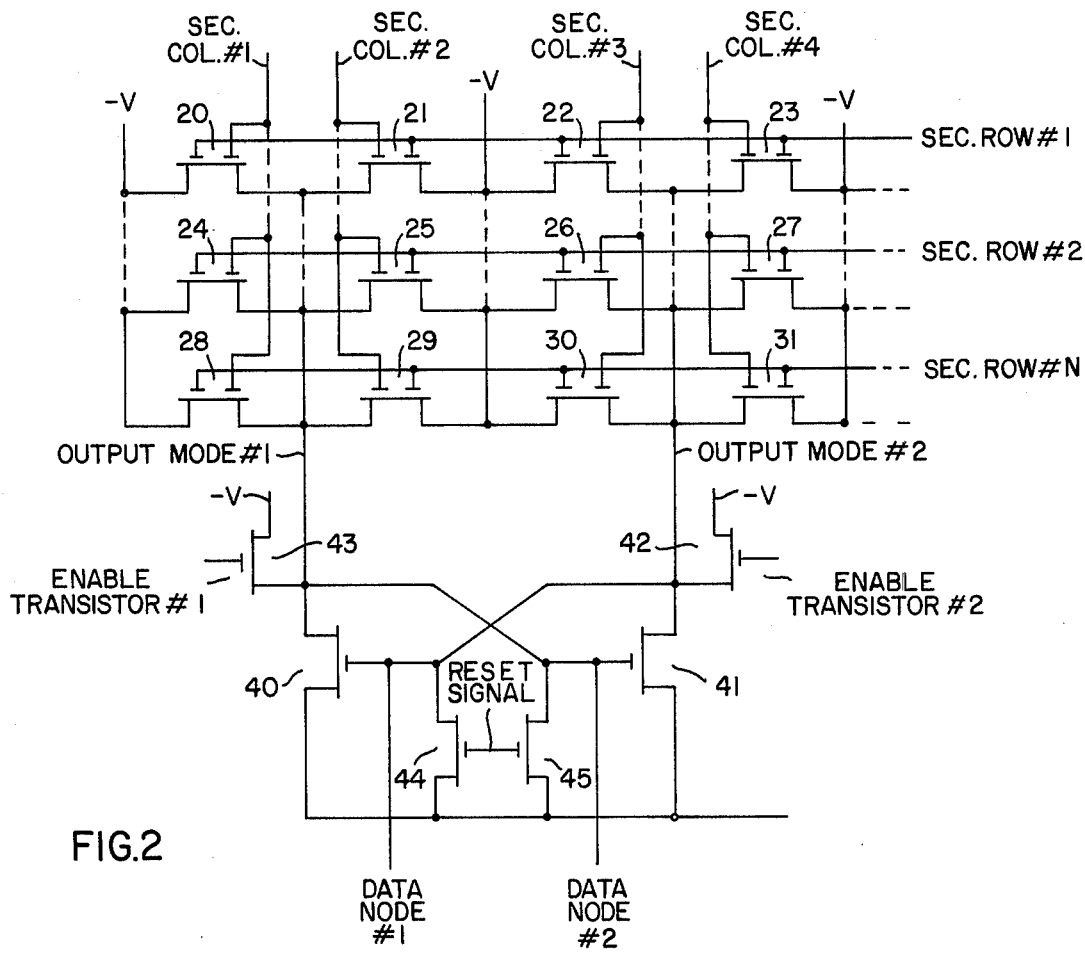
FIG. 2 is a schematic diagram of the dual mode MNOS memory system.

FIG. 2 is a schematic diagram of the preferred embodiment of the array and the associated sensing circuit. This schematic illustrates an array which includes four columns and three rows. The array can be easily expanded by including more rows and additional columns to provide more storage locations.

The dual gate MNOS memory transistors comprising the array are identified in FIG. 2 by reference numerals 20 through 31. Each of the memory transistors are functionally equivalent to the series combination of a memory and non-memory MNOS transistor. The threshold of the memory portion of the transistor can be shifted by coupling an enable signal to the non-memory gate and utilizing well known techniques to bias the memory portion of the transistor such that charges tunnel through the gate insulator and become trapped in an overlying layer. These techniques are well known to those skilled in the art and will not be discussed in detail.

Memory transistors comprising the first and second columns, 20, 24, 28, 21, 25 and 29 have their source terminals connected in common to form first output node. Similarly, memory transistors 22, 26, 30, 23, 27 and 31, comprising the third and fourth columns have their source terminals connected in common to form a second output node. Two non-memory MNOS transistors 40 and 41 comprise the cross-coupled pair used for sensing the threshold state of the dual gate MNOS memory transistors 20 through 31. Cross-coupling is accomplished by coupling the drain terminal of transistor 41 to the gate terminal of transistor 40 and the drain terminal of transistor 40 to the gate terminal of transistor 41. The sensing circuit also includes two reference transistors, identified by reference numerals 43 and 42. The source terminal of a first reference transistor 43 is coupled to the drain terminal of the first transistor of the cross-coupled pair, 40. Similarly, the source terminal of the second reference transistor 42 is coupled directly to the drain terminal of the second transistor of the cross-coupled pair 41. The sensing circuit is coupled to the array of MNOS memory transistors by connecting the drain terminal of the first transistor 40 of the cross-coupled pair to the first output mode and the drain terminal of the second transistor 41 of the cross-coupled pair to the second output mode.

The sensing circuit also includes two additional reset transistors, 44 and 45. The drain terminals of these transistors are coupled to the gates of the two transistors comprising the cross-coupled pair, 40 and 41. During the reset cycle these two transistors are biased to a high conductivity state by a reset signal coupled to their gate terminals. This holds the drain terminals of the two transistors, 40 and 41, comprising the cross-coupled pair at a very low voltage during the periods when a memory transistor is not being interrogated to determine its threshold state. Other types of sensing circuits may be used. The sensing circuit discussed above is an illustrative embodiment of a useful circuit.

To determine the threshold state of a particular memory transistor, for example, the first transistor of the array illustrated by reference numeral 20, a column select signal is coupled to the column select gate of memory transistors 20, 24 and 28 and a select row signal is coupled to the second gate of transistors 20, 21, 22 and 23. Under these conditions, the only memory transistor in the array which will have an enable signal coupled to both of its gates is transistor 20. The first reference transistor 43 is turned off by coupling a low voltage signal to its gate and the second reference transistor 42 is turned on by coupling a negative voltage to its gate. A reset signal is coupled to the gates of reset transistors 44 and 45 turning these two transistors off. Under these conditions, the state of the cross-coupled pair will be determined by the transconductance of the enabled memory transistor 20 relative to the transconductance of the enabled reference transistor 42. For example, if the transconductance of the enabled reference transistor 42 is lower than the transconductance of the enabled memory transistor 20, the first transistor 40 of the cross-coupled pair will be turned on and the second transistor 41 of the cross-coupled pair will be turned off, causing a negative voltage to appear at data node No. 1 and a more positive voltage to appear at data node No. 2.

In the two transistor per bit mode, the operation of the array is similar except that a disable signal is coupled to the gates of both of the reference transistors, 42 and 43. Two memory transistors are enabled by coupling column select signals to two columns of the array and a row select signal to one of the rows. For example, column select signals could be coupled to columns 1 and 3 and a row select signal is coupled to row No. 1. Under these conditions, enable signals will be coupled to both of the gates of the first memory transistor 20 and the third memory transistor 22 of the array. Reset transistors 44 and 45 are turned off. Under these conditions, the first memory transistor 20 becomes the load for the first transistor 40 of the cross-coupled pair while the third memory transistor 22 becomes the load for the second transistor of the cross-coupled pair 41. The state of the cross-coupled pair is then determined by the relative transconductance of the first and third memory transistors of the array.

The one transistor per bit mode described above is advantageous in that it permits more data to be stored in an array of fixed size (number of memory transistors). However, the circuit is not totally symmetrical in that the status of each of the memory transistors is determined by comparing the transconductance of the enabled memory transistor to the transconductance of the enabled reference transistor. Since these two transistors are in general not identical, the circuit is slightly non-symmetrical. This non-symmetry reduces the noise margin of the array. Additionally, there is no compensation for shift in the threshold of the memory transistors due to elapsed time. By contrast, in the two transistor bit per mode, the load for both of the transistors comprising the cross-coupled pair is identical. Additionally, a smaller shift in transconductance can be detected because in writing the data into the location, the threshold of one transistor is increased while the other is decreased. This increases the absolute difference between the two. Additionally, shift in the threshold of the two transistors as a result of read-write cycling tends to be in the same direction, thus increasing the memory retention time of the array.

From the above description, it is clear that the array illustrated in FIG. 2 can be operated in two modes. In the first, or one transistor per bit mode, high packaging density is achieved because more bits of data can be stored in an array of a given size. In the second, or two transistor per bit mode, the performance parameters such as noise margins and memory retention times are greatly improved due in part to the symmetry of the circuit. Thus, the one transistor per bit mode can be selected for those applications not subjected to severe environmental constraints or long memory retention times while the second mode can be selected for more severe applications requiring a longer memory retention time.

The sensing circuit illustrated above and discussed with reference to FIGS. 1 and 2 can be easily implemented using the same substrate as the memory transistors and standard MNOS technology. For this reason, no detailed implementation of the sensing circuit will be provided; however, symmetry of the array of dual gate MNOS memory transistors is advantageous when the array is implemented as an integrated circuit. For this reason, a detailed description of one implementation of this array as an integrated circuit will be described below.

Figure 3:
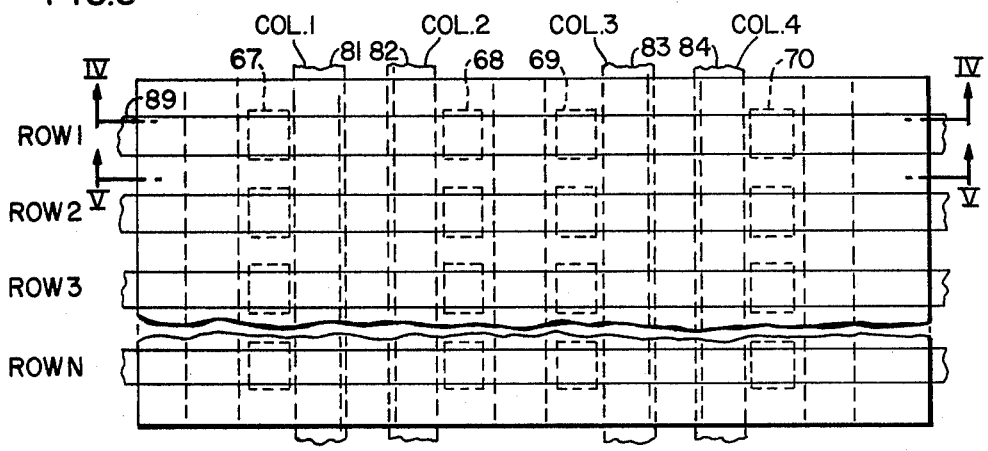
FIG. 3 is a top view of a semiconductor chip illustrating an integrated circuit implementation of an array of dual gate MNOS memory transistors.
Figure 4:
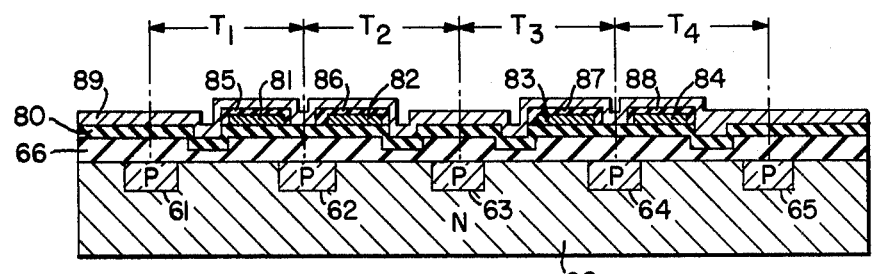
FIG. 4 is a cross-sectional view of the semiconductor chip illustrated in FIG. 3 taken along lines IV—IV.
Figure 5:
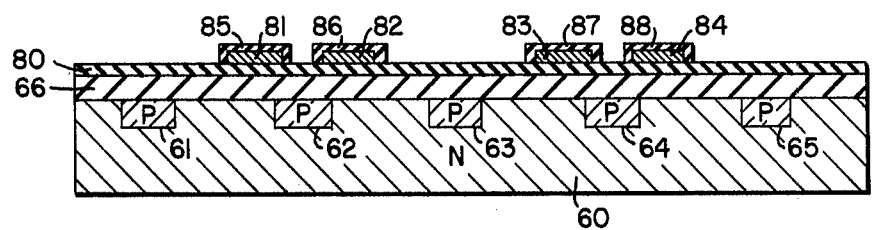
FIG. 5 is a cross-sectional view of the semiconductor chip illustrated in FIG. 3 taken along lines V—V.

FIG. 3 is a top view of one implementation of the array of dual gate MNOS memory transistors as an integrated circuit. FIGS. 4 and 5 are cross-sections taken through the integrated circuits illustrated in top view in FIG. 4 along lines IV-IV' and V-V', respectively. The first transistor of the array illustrated at reference numeral 20 in FIG. 2 is identified as T1 in FIG. 4. Similarly, the other MNOS memory transistors comprising the first row of the array and identified by numbers 21, 22 and 23 in FIG. 2 have been labeled T2, T3 and T4 in FIG. 4.

The transistors forming the elements of the array are preferably formed in an n-type substrate 60. Five p-type regions forming the drain and source junctions are identified by reference numerals 61 through 65. The regions of the substrate 60 between the p conductivity regions 61, 62, 63, 64 and 65 form the channels of the transistors comprising the array. Columns one and two share a column p-type source region 62. Similarly columns three and four share a common p-type source region 64. The regions forming the drain junctions of column one, columns two and three and column four are respectively shown at reference numerals 61, 63 and 65.

Immediately overlaying the upper surface of the n-type substrate 60 is a first insulating layer 66 which may be silicon oxide, for example. This layer includes thinner portions spaced between the p-type regions 61 through 65. The top view of this thin region for the first transistor of the array is illustrated at reference numerals 67 of FIG. 3. The thin oxide regions associated with the second, third and fourth transistors of row No. 1 are similarly illustrated in top view at reference numerals 68, 69 and 70 of FIG. 3.

Immediately overlaying the first insulating layer 66 is a second insulating layer 80. As previously discussed, the first insulating layer 60 is preferably silicon oxide, while the second layer 80 is preferably of silicon nitride. Thin regions of the oxide layer in conjuction with the overlying nitride region is the gate insulator for the memory portion of the transistor. The thicker portions of this layer and the nitride layer is the gate insulator for the non-memory portion of the transistor. The critical characteristic of the second insulating layer 80 is that it must have high charge trapping properties to permit the memory portion of the transistor to function as previously described.

Electrically conductive strips 81, 82, 83 and 84 are the column selection gate electrodes which overly the second insulating layer 80. Thin insulating layers identified by reference numerals 85, 86, 87 and 88 cover the upper surface of the insulating strips forming the column select gate electrodes. If high conductivity polycrystalline silicon is used for the conductive strips, the insulating layers can be conveniently formed by simply oxidizing the polycrystalline silicon. Overlying the silicon nitride insulating layer 80 and the insulating layers covering the polysilicon strips is a strip of electrically conductive material 89 which may be aluminum, for example. The portions of this layer overlying the thin regions of the silicon oxide layer 66 form the row select and memory gates of each of the transistors.

FIGS. 5 is a cross-sectional view of the array illustrated in top view of FIG. 3 taken along line V-V'. From this view, it is clear that no transistor action occurs in the areas of the substrate between the row select electrodes because there is no gate electrode in this region.

The density of the array may be increased by utilizing thin strips of thin oxide in the memory region instead of the isolated rectangular region illustrated in FIG. 3. This would allow for the interlacing of additional row select lines between those illustrated. A convenient method of forming these additional row select lines is to first form alternate row select lines of high conductivity polysilicon and oxidizing the top surface to form an insulating layer. Additional row select lines is then formed between each of the polysilicon lines by depositing and etching an aluminum layer.

I claim:

1. An MNOS memory comprising:
    a. plurality of dual gate MNOS memory transistors arranged in at least first and second columns and at least one row with corresponding column select lines and row select lines coupled thereto, at lest one terminal of each of the transistors in said first column to form a first data node, at least one terminal of each of the transistors in said second column coupled together to form a second data node;
    b. means for coupling said two pairs of columns of transistors;
    c. a differential sense circuit having at least first and second sense terminals; and
    d. means for connecting said first and second sense terminals to said first and second data nodes to selectively sense the threshold state of a transistor selected from said plurality of dual gate MNOS transistors comprising said array such that the load represented by each of said sense terminals is substantially identical.

2. An MNOS memory array comprising:
    a. a plurality of MNOS memory transistors arranged in columns and rows to form an array having two data nodes, said array also having column and row select lines for selectively enabling a particular one of the transistors to produce a signal at at least one of said data nodes indicative of the threshold state of said enabled transistor; and
    b. a differential sensing circuit coupled to said two data nodes for producing a signal indicative of the threshold state of said enabled transistor.

3. An MNOS memory comprising:
    a. a plurality of MNOS memory transistors arranged in columns and rows to form an array having at least two data nodes, said array also having column and row select lines for selectively enabling the transistors in groups of two to produce two signals at said data nodes indicative of the threshold state of the two enabled memory transistors; and b. a differential sensing circuit coupled to said two data nodes to produce a signal indicative of the difference in the threshold states of said two enabled transistors.

4. An MNOS memory array comprising:
a. a semiconductor substrate of a first conductivity type having parallel regions of a second conductivity type therein;
b. a first plurality of electrically conductive strips parallel to said parallel regions of a second conductivity type and spaced from said substrate by an insulator;
c. a second plurality of electrically conductive strips positioned at substantially right angles with respect to said first plurality of electrically conductivity strips and spaced from said substrate and said first plurality of electrically conductive strips by an insulating layer to form a dual gate MNOS transistor at the intersection of said first and second conductive strips; wherein
d. at least a first one of said regions of a second conductivity type acts as a data node for sensing the threshold state of a first portion of the transistors comprising said array and at least a second one of said regions of a second conductivity type acts as a second data node for sensing the threshold state of a second portion of the transistors comprising said array.

5. An integrated MNOS memory array comprising in combination:
a. a first group of dual gate MNOS memory transistors with each transistor in said first group having a common source region which acts as a first data node for sensing the threshold state of a transistor within this group;
b. a second group of dual gate MNOS transistors with each transistor in said second group having a common source region which acts as a second data node for sensing the threshold state of a transistor within this group; and
c. a two input terminal differential sensing circuit coupled to said first and second data nodes; wherein
d. the load presented to said sensing circuit by said first and second data nodes is substantially identical.

6. A memory array in accordance with claim 5 wherein each of dual gate memory transistors comprise:
a. a substrate of a first conductivity type including therein first and second regions of a second conductivity type, said regions respectively functioning as the drain and source of said transistor with the portion of said substrate between said drain and source forming the channel of said transistor;

b. a first gate overlying and spaced from a first portion of said channel by a first insulating structure; and
c. a second gate overlying and spaced from a second portion of said channel by a second insulating structure, said second insulating structure having change tunnelling and trapping characteristics permitting the threshold voltage of the underlying portion of the channel to be selectively shifted.

7. A memory array in accordance with claim 6 wherein said substrate is N conductivity type.

8. A memory array in accordance with claim 6 wherein said first insulating structure comprises a layer of silicon oxide and a layer of silicon nitride.

9. A memory array in accordance with claim 6 wherein selected members of said first and second groups of transistors utilize a common drain region.

10. A memory array in accordance with claim 9 wherein selected members of said first and second groups of transistors utilize separate drain regions.

11. A memory array in accordance with claim 10 wherein said memory array is symmetrical about said common drain region.

12. An MNOS memory array comprising:
a. a plurality of MNOS memory transistors, each having first and second gates, a source, and a drain, said transistors being arranged in a plurality of rows of transistors and first and second pairs of columns of transistors, said first pair including first and second columns of transistors, said second pair including third and fourth columns of transistors;
b. column select means corresponding to each of said columns for coupling together the first gates of said transistors in said columns, row select means corresponding to each of said rows for coupling together the second gates of said transistors in said rows;
c. means for coupling the sources of the transistors in said first and second columns and forming a first group of source nodes,
means for coupling the sources of the transistors in said third and fourth columns and forming a first group of drain nodes,
means for coupling the drains of the transistors in said second and third columns and forming a second group of source nodes;
d. means for coupling said first group of source nodes and forming a first data node,
means for coupling said second group of source nodes and forming a second data node; and
e. differential amplifier means having two inputs, which inputs are coupled to said data nodes for sensing the logic state of one of said transistors selected by said column select means and said row select means, and having two outputs, the signals on which are indicative of the logic state of said selected transistor.

* * * * *

UNITED STATES PATENT AND TRADEMARK OFFICE
CERTIFICATE OF CORRECTION

PATENT NO. : 4,090,257
DATED : May 16, 1978
INVENTOR(S) : D. W. Williams

It is certified that error appears in the above-identified patent and that said Letters Patent are hereby corrected as shown below:

Column 1, after the Title insert the following paragraph:

-- The invention herein described was made in the course of or under a contract or a subcontract with the Department of the Air Force. --.

Signed and Sealed this

Twenty-seventh Day of February 1979

[SEAL]

Attest:

RUTH C. MASON
Attesting Officer

DONALD W. BANNER
Commissioner of Patents and Trademarks